Figure 1B:
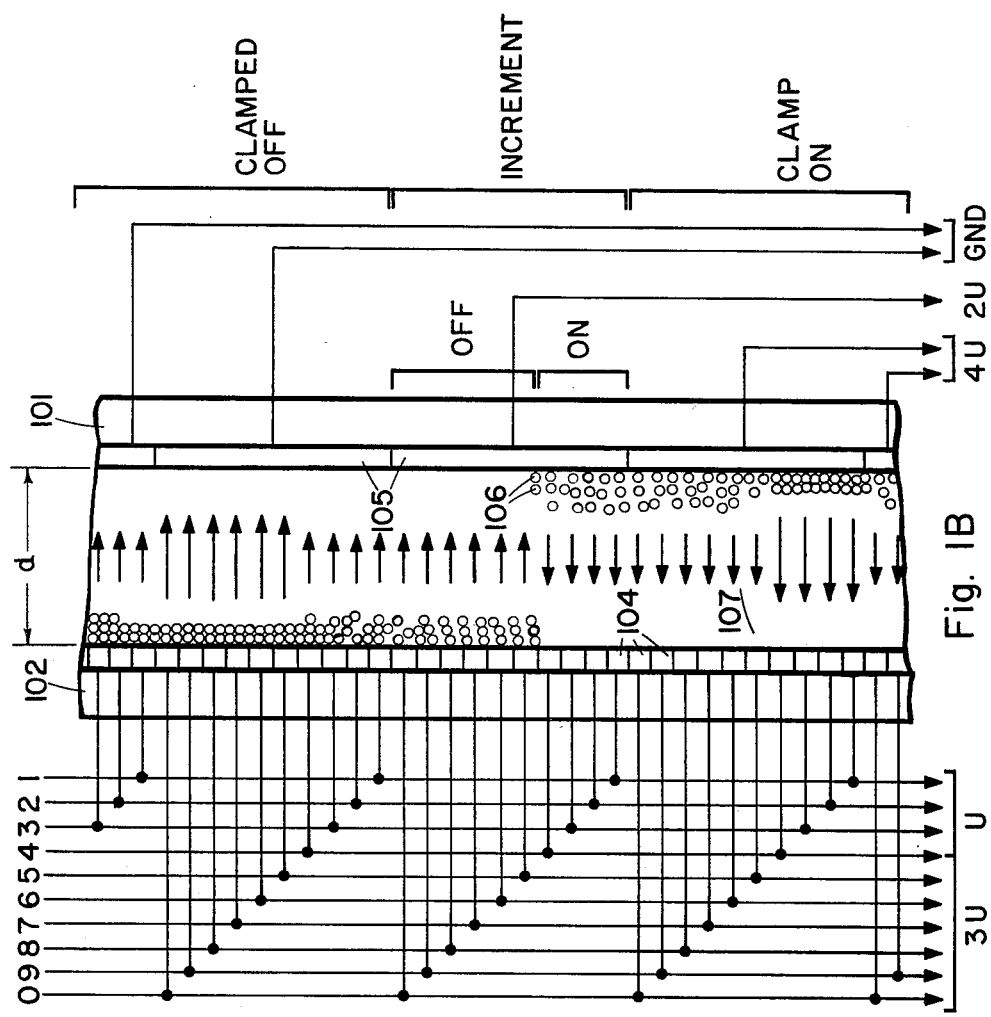

United States Patent [19]
White

[11] 4,450,440
[45] May 22, 1984

[54] CONSTRUCTION OF AN EPID BAR GRAPH
[75] Inventor: Roger P. White, Yonkers, N.Y.
[73] Assignee: U.S. Philips Corporation, New York, N.Y.
[21] Appl. No.: 334,110
[22] Filed: Dec. 24, 1981
[51] Int. Cl.³ .............................................. G09G 3/00
[52] U.S. Cl. .................................. 340/753; 340/787; 204/299 R
[58] Field of Search ............... 340/786, 787, 788, 724, 340/722, 753, 754; 204/299 R

[56] References Cited
U.S. PATENT DOCUMENTS 4,041,481  8/1977  Sato ..................................... 340/722
4,062,009  12/1977 Raverdy et al. ..................... 340/787
4,203,106  5/1980  Dalisa et al. ......................... 340/787
4,218,302  8/1980  Dalisa et al. ..................... 204/299 R Primary Examiner—Gerald L. Brigance
Attorney, Agent, or Firm—Paul R. Miller

[57] ABSTRACT

An electrophoretic bar graph display is provided wherein the number of electrodes is significantly reduced. This occurs by application of one of three voltage values to each of a plurality of electrodes at one side of the display in accordance with the value to be displayed, and one of two voltage values to each of a number of electrodes at the other side of the display corresponding to each one of the plurality. The two voltage values alternate in value with the three voltage values. A cursor type display can also be provided having an indication segment of contrasting color from the remaining electrophoretic fluid.

12 Claims, 12 Drawing Figures

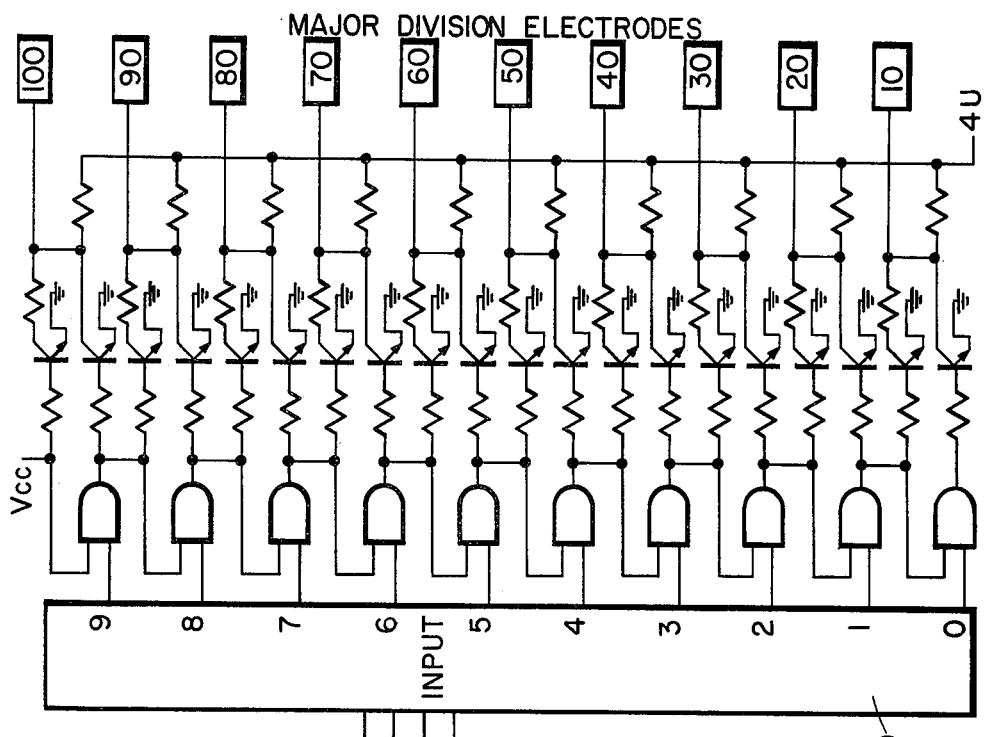
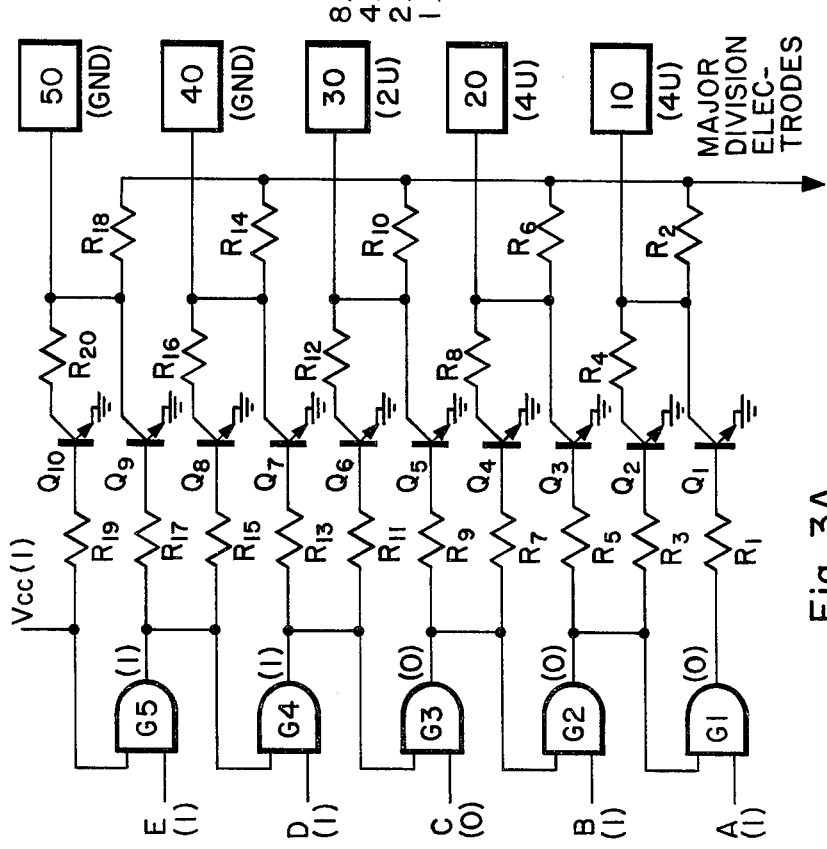
Fig. 3B
Fig. 3A

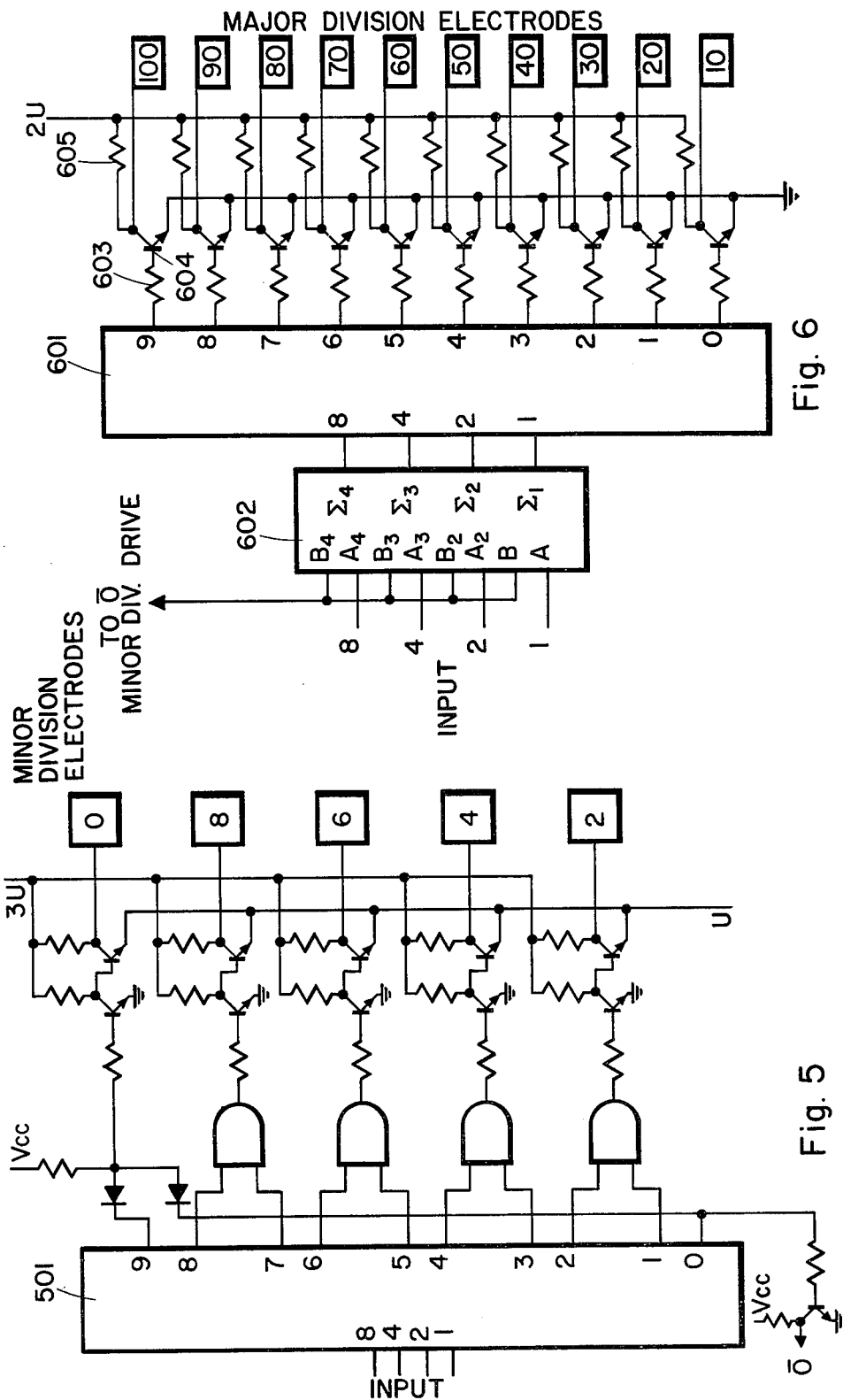

CONSTRUCTION OF AN EPID BAR GRAPH

The present invention is directed to an electrophoretic type imaging display device which is constructed as a bar graph type of apparatus.

Bar graphs displays offer various distinct advantages over digital and mechanical analog panel meters in many applications. For example, they exhibit no overshoot when the input voltage changes, they can be made to have a great accuracy and resolution, they are easy to interpret, and they are superior for indicating a trend or for comparing values shown side by side on multiple bar graphs. Bar graph displays have been constructed using light emitting diodes (LED), incandescent lamps, plasma panels, and liquid crystals (LCD).

Of these prior devices, the patent to Robert, U.S. Pat. No. 4,191,955, provides a bar graph display utilizing a liquid crystal film located between plate electrodes and point electrodes. In this prior structure, multiple voltages are utlized to control the device at a state higher than a threshold voltage value. Moreover, such a structure is designed to preferably utilize low-frequency AC voltages.

Other bar graph type displays include the patent to Kaufmann et al, U.S. Pat. No. 4,258,364 having a liquid crystal type structure with various selected and non-selected electrode elements being driven by drive voltages of differing multiples of a threshold voltage for the display elements. Also, an electrochromic display device being aligned in a plurality of segment electrodes has been constructed for displaying an analog value in a bar graph fashion in accordance with the patent to Uede et al, U.S. Pat. No. 4,247,855. This latter prior device utilizes a shift register connection to each of the electrodes of the structure.

Among various electrophoretic matrix display devices, the patent to Sato, U.S. Pat. No. 4,041,481 discusses a matrix display panel which may have utilization in a bar graph fashion. However, while the Sato reference discusses X-Y matrix display panels, a construction useful for bar graphs is not provided nor discussed. Moreover, the matrix display device of the reference sets forth a complex driving mechanism which appears to result in a flashing of the display, and nowhere indicates any practical technique for constructing a bar graph display.

The present invention provides an electrophoretic bar graph display having distinctive characteristics over the prior art. Such a bar graph display according to the present invention relies on the advantage of electrophoretic image displays (EPID) which provide a wide viewing angle, provide many possible color combinations, and enable low power consumption. Electrophoretic displays are passive devices, and therefore will not wash out under high ambient light conditions, such as sunlight, as do active displays. Moreover, electrophoretic devices can be illuminated for dark ambients. Finally, the present invention does not require that the electrophoretic suspension have a voltage threshold for switching to occur so that complicated switching waveforms are not required, thereby making a simple construction. Since no resetting is required, flashing does not occur.

The electrophoretic bar graph display of the present invention involves an electrophoretic fluid having suspended particles filling the space between two separated substrates at least one of which is transparent. In this construction, a first electrode structure is formed on the surface of one of the substrates facing the fluid and a second electrode structure is formed on a surface of the other substrate facing the fluid with at least one of the these electrode structures being substantially transparent. One of the electrode structures provides a plurality of electrodes and the other electrode structure provides an equal multiple of electrodes for each of the plurality of electrodes. Finally, the electrodes are connected to a multilevel voltage selection system which enables one of three voltages to be connected to the plurality of electrodes, and one of two separate voltages can be connected to the multiple of electrodes for each of the plurality of electrodes with the two voltages alternating in value with the three voltages applied to the plurality of electrodes. This enables significant lead reduction.

This structure enables a bar graph construction wherein the number of electrical leads between the bar graph display and the external drive circuitry amount to the number of multiples of the second electrodes added to the number of the plurality of the first electrodes. Thus, a significant reduction is achieved in the number of leads required.

In this structure only a simple electrophoretic display construction is required. By this construction, both a bar graph indicator structure can be provided or a cursor indicator structure can be made. A simple voltage multiplexing structure can be used requiring only 5 different voltage levels where fast electrical addressing to optical outputs, in the order of 200 milliseconds, can be provided. Whether the display is a bar graph type or cursor type is only dependent on the driver electronics used, and does not depend on the display itself.

A simple electrophoretic display consists of charged pigments particles of one color being suspended in a dyed mixture of solvents of a contrasting color. The solvents are chosen and mixed to provide a density match with the pigment particles and thereby provide a gravitationally stable suspension. The suspension may be contained between two glass plates with transparent conductors on the facing surfaces, and separated by approximately 50 microns. The two pieces of glass are sealed around their periphery with corresponding electrical contacts being made to the conducting surfaces.

In the arrangement according to the present invention, the electrode structure on one surface will constitute n major scale divisions with n equalling 10, 20, 30, . . . , while the electrode structure on the other glass surface will constitute m minor scale divisions with m equalling 1, 2, 3, . . . In this construction only m+n electrical leads leading to the external drive circuitry are required. Moreover, 5 voltage levels may be utilized with multilevels of ground, 2U, or 4U being selectively connected to the n major scale division electrodes, while voltage levels of U or 3U are connected to the m minor scale division electrodes. By selective connections of these voltages, the electrophoretic cell, or portions of the cell, may be turned on by giving an appropriate voltage, turned off by giving an appropriate different voltage, or maintained without change.

Figure 1A:
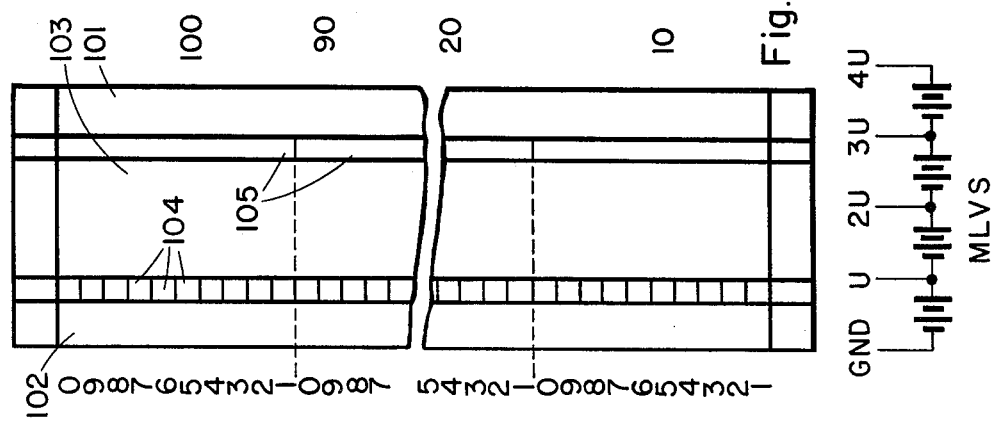
Figures 2A, 2B, 2C:
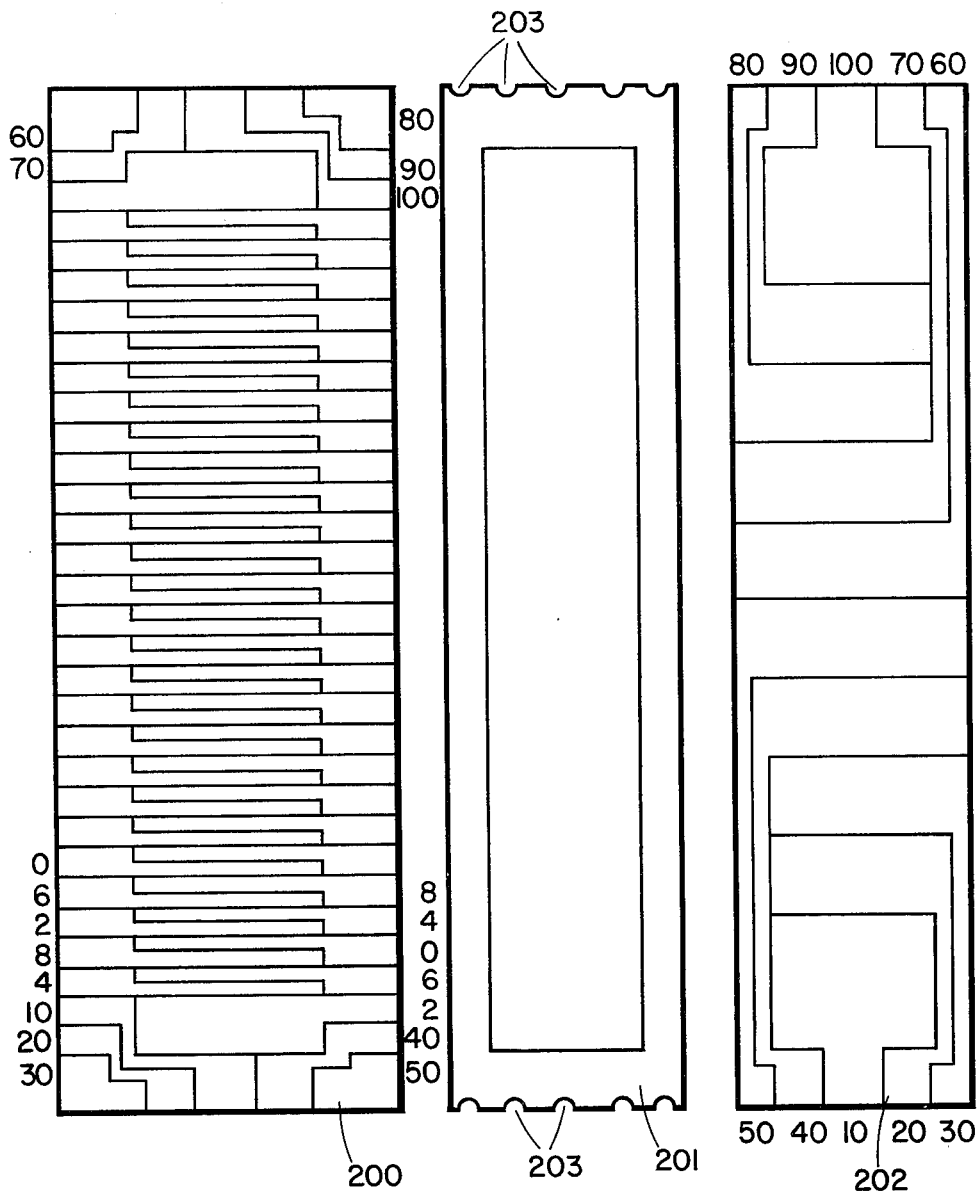
Figure 4B:
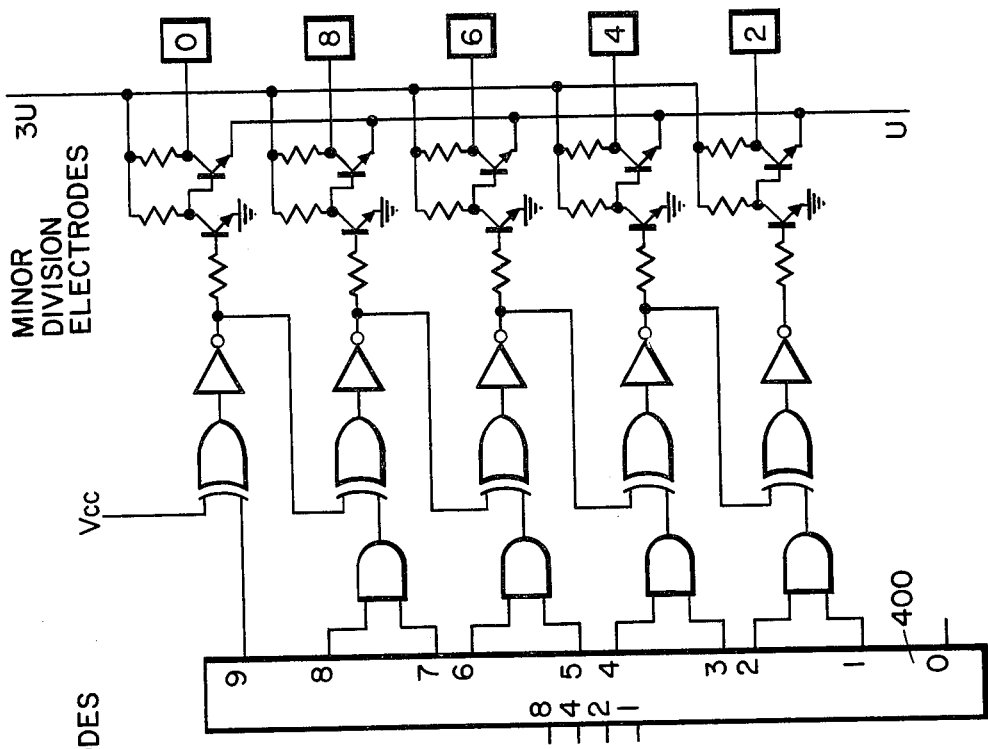
Figure 4A:
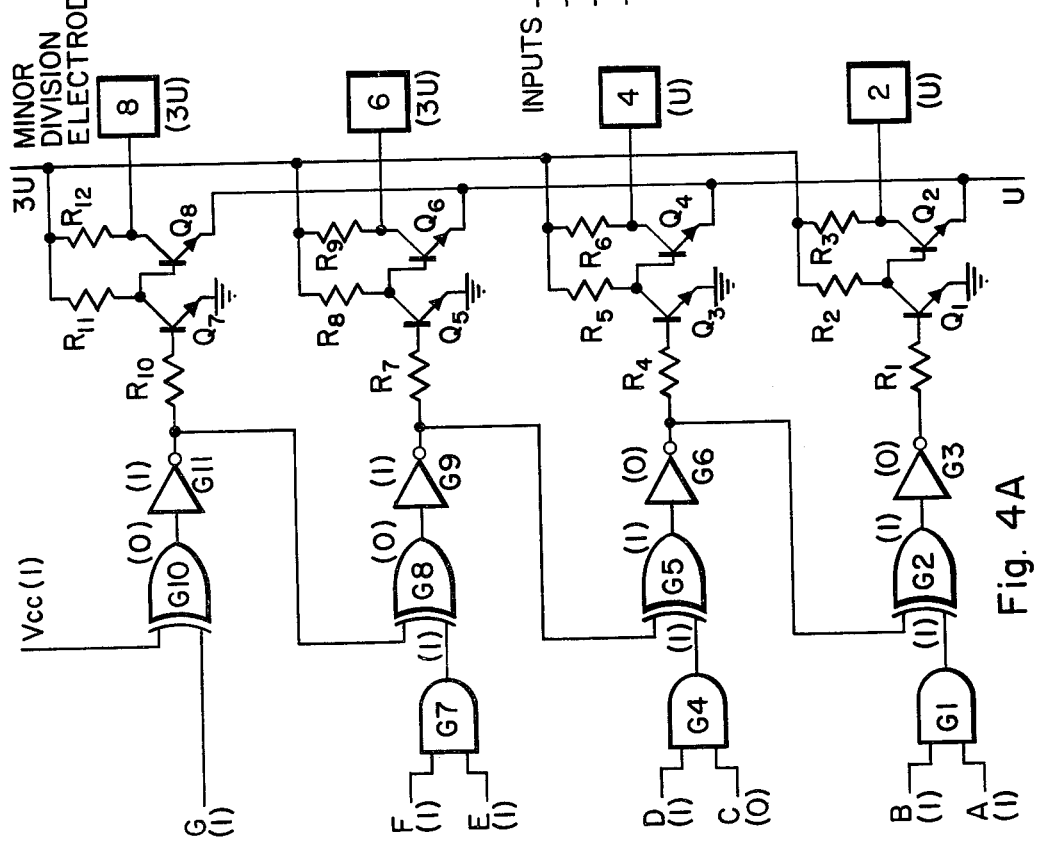
Figure 4C:
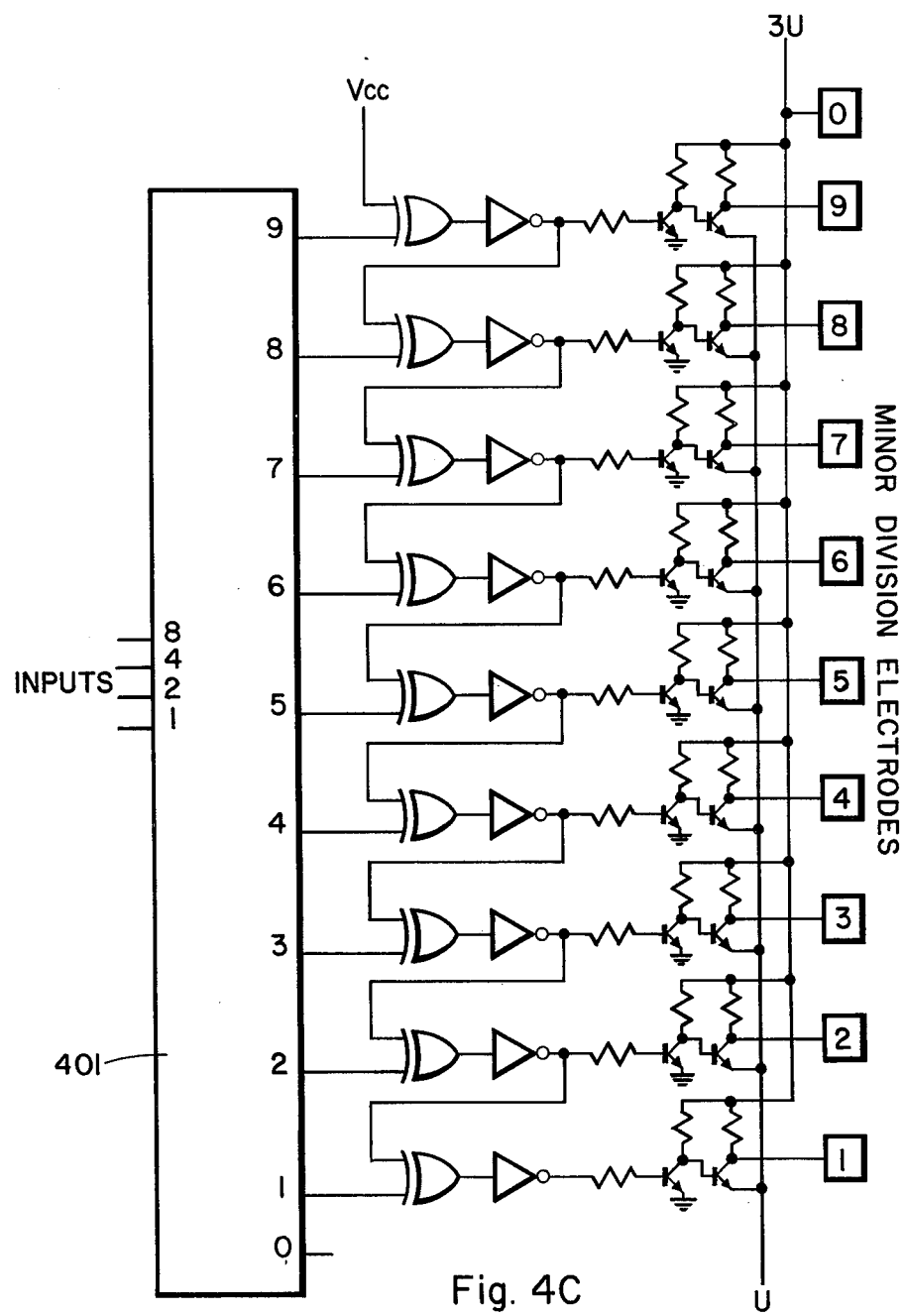

These various aspects of the present invention may be further understood by reference to the accompanying drawing figures which provide various examples without limitation, and wherein, FIG. 1A illustrates a cell construction with appropriate driving electrodes in accordance with the present invention, FIG. 1B illustrates the operation of the multilevel voltage selection system according to the present invention, FIG. 2A illustrates the etching patterns for the minor division electrodes in accordance with the present invention, FIG. 2B illustrates a sealing frame between respective electrode portions according to the present invention, FIG. 2C illustrates the etching patterns for the major division electrodes in accordance with the present invention, FIG. 3A illustrates a portion of the major division drive circuitry in accordance with the present invention, FIG. 3B illustrates the major division drive circuitry for a certain arrangement according to the present invention, FIG. 4A illustrates a portion of the minor division drive circuitry in accordance with the present invention, FIG. 4B illustrates the minor division drive circuitry for the present invention, FIG. 4C illustrates the minor division drive circuitry for another aspect of the present invention, FIG. 5 illustrates the minor division drive circuitry for a cursor display according to the present invention, and FIG. 6 illustrates a major division drive circuitry for a cursor display according to the present invention.

A bar graph may ideally consist of a narrow rectangular area divided into many segments, such as illustrated in FIG. 1A. For example, a bar graph with a 1% resolution is divided into 100 segments. This can be seen in the drawing figures by way of the minor division electrodes 104 indicated in multiples from 1 to 10 at the left side of FIG. 1A, for example, while the major division electrodes 105 are set forth in values from 10 to 100. As indicated in FIG. 1A, there are 10 minor division electrodes 104 for each major division electrode 105.

The electrophoretic bar graph construction of the present invention involves a plurality of charged pigment particles 106, such as illustrated in FIG. 1B, suspended in electrophoretic fluid 107. Assuming that the pigment particles are negatively charged, the particles will move to the most positive of an opposed pair of electrodes 104, 105. There is no voltage threshold required for pigment motion in the electrophoretic system.

In the portion of the bar graph display illustrated in FIG. 1B the major division electrodes 105 may be provided in one of three voltage states, i.e. the voltage values of ground, 2U and 4U, where U is an operative voltage value. The minor division electrodes 104 are connected in parallel relative to each value of 10 as shown in FIG. 1A. For example, all of the first minor division electrodes 1 are connected in parallel, while all of the second minor divisions electrodes 2 are connected in parallel, and so forth. These voltage values have a voltage value of U or 3U.

In this scheme, a major division electrode 105 may be clamped ON (most positive voltage, 4U), clamped OFF (least positive voltage, ground) or allowed to increment (a reference voltage midway between the clamped ON and clamped OFF voltage, i.e. 2U). The minor division electrodes 104 may attain one of either two possible voltage levels, an ON level (a level midway between the reference and clamped OFF levels, or U) and an OFF level (midway between the reference and clamped ON levels, or 3U). When a major division electrode 105, or decade electrode, is clamped ON, it does not matter which of the two available voltages U or 3U the minor division electrodes 104 are made since the major division electrode 105 is the most positive and will attract the negatively charged pigment 106. Likewise, when a major division electrode 105, or decade electrode, is clamped OFF, it is the most negative and the negative pigment 106 will be attracted to the more positive (at either level) minor division electrodes 104. The only area where the minor division voltage levels determine the state is where the major division electrode 105 is at the reference voltage level 2U. The electrode voltage levels required for proper operation for this type of bar graph are shown in Table 1.

TABLE 1

| | Bar Graph Voltage Levels | |
|---|---|---|
| Major Division | Major Division Level | Minor Division Level |
| Clamp ON | 4U | U or 3U |
| Clamp OFF | Ground | U or 3U |
| Increment On | 2U | U |
| Increment Off | 2U | 3U |

The magnitude of the electric field is either U/d or 3U/d, regardless of applied voltage. The value of U is chosen so that differences in pigment packing result in negligible contrast whether the magnitude of the field is U/d or 3U/d. The arrangement of connecting all of the No. 1 minor division electrodes in parallel, all of the No. 2 minor division electrodes in parallel, all of the No. 3 minor division electrodes in parallel, and so forth results in a matrix type structure. The number of drivers required using this technique is drastically reduced so that the number of drivers is equal to the number of major division electrodes plus the number of minor division electrodes divided by the number of major division electrodes.

The electrophoretic bar graph display according to the present invention may be constructed of two glass substrates 101 and 102, each coated on one surface with a transparent conductor such as indium oxide. The conductor is patterned using photolithographic techniques. The two substrates 101 and 102 are then placed together with the conducting surfaces in opposition at a 50 micron spacing and sealed. Fill holes (not shown) are provided, for example, drilled in one substrate, so that an electrophoretic suspension 107 consisting of pigment particles 106, light in color, suspended in a dye mixture of solvents of a contrasting color can be provided in the space between the two substrates. The fill holes are then sealed and the appropriate drive circuitry is connected. Alternatively, the suspension can be introduced in an evacuated system.

FIGS. 2A and 2C illustrate the electrode patterns etched into glass substrates 200 and 202 for the respective minor and major division electrodes of a two percent bar graph, for example. The minor division electrode pattern is etched on one substrate 200 as shown in FIG. 2A. In this arrangement there are 50 minor division electrodes terminating in contacts alternating on opposite sides of the substrate. Also, there are patterns etched on the ends of the substrate which will be interconnected with the other electrode structure after the sealing operation. The other substrate 202 is illustrated in FIG. 2C, and is etched with the pattern for the ten major division electrodes 10 through 100. This substrate 202 may be constructed smaller in width than the other substrate 200 so that electrical connections to the drive circuitry may be made to the contacts etched into substrate 200. Both substrates are of the same length.

FIG. 2B illustrates the sealing frame 201 utilized between the front and rear substrates 200, 202. The inside dimensions of the frame are made such that the sealing frame 201 will slightly overlap the border lines for the active area of the display. The outside dimensions are made slightly larger than the front substrate to prevent any foreign conducting material from entering between the front and rear conductors at the edges, thereby causing short circuits. The ends of the sealing frame 201 are notched with notches 203 so as to provide interconnections between the front and rear electrodes after the sealing operation has occured. The thickness of the sealing frame 201 is such that after the sealing operation, the internal separation of the electrodes will be approximately 50 microns.

In this structure, sealing is obtained by carefully positioning the two substrates 200 and 202 with the sealing frame 201 therebetween so that the major division isolation lines, or spaces between major division electrodes, line up with every fifth (for a 2% display) or every tenth (for a 1% display) minor division isolation line, or spacing between minor division electrodes. Alignments between the substrates 200 and 202 and the sealing frame 201 can be made by a simple jig where the material of the substrates is cut accurately and a photolithographic etching operation is done carefully. The sandwich of materials is placed in a press with heated platens and appropriate pressure-temperature-time combinations are used to seal the electrode surfaces to the sealing frame 201 with the appropriate separation spacing between electrode surfaces. An appropriate material for the sealing frame may be polyethylene terephythalate, or Mylar.

Conducting silver paint, for example, can be applied to the notches 203 in the ends of the sealed cell to form an interconnection between the major division electrodes on one substrate 202 and contacts etched into the other substrate 200. In this manner, all electrical contacts to the drive circuitry can be provided from one substrate surface. The completed structure of the glass substrates and sealing frame may be mounted on a glass base printed circuit board (not shown). This structure is patterned to provide the proper paralleling of the minor division electrodes and to provide for the mounting of a card edge connecter perpendicular to the circuit board for insertion of the drive electronics board. Other connection schemes can be used such as a conductive elastomer system. Sixty single pin sockets can be installed, thirty to a side at the proper spacing for accepting the connecter pins attached to the display.

FIG. 3A illustrates a portion of the major division drive circuitry. In this example, electrodes 10 and 20 will be at the voltage level 4U to be clamped ON, electrode 30 will be at the level 2U for incrementing, and electrodes 40 and 50 will be clamped OFF (ground). Since electrode 30 is the incrementing electrode, C is the selected input. The selected input is at a logical 0 level and inputs A, B, D and E are at a logical 1 level.

Starting at the top, AND gate G5 receives a logical 1 on both of its inputs and therefore its output is a logical 1. Transistor Q10 is turned on because its base is at $V_{cc}$. However, transistor Q9 is turned on by the output of AND gate G5. With transistor Q9 on, it is essentially a short circuit and electrode 50 is virtually at ground potential.

Likewise, both inputs of AND gate G4 are at a logical 1 (D input and AND gate G5 output) and for the same reasons, electrode 40 is at ground potential.

Transistor Q6 is turned on because AND gate G4 has an output of a logical 1, and transistor Q5 is turned off since AND gate G3 has an output at a logical 0. Resistors $R_{10}$ and $R_{12}$ form a simple voltage divider since transistor Q6 is on, and accordingly, one half of 4U, or 2U, is applied to electrode 30.

One input of AND gate G2 receives a logical 0 from the output of AND gate G3 and the other input receives a logical 1 from input B. Therefore, the output is a logical 0. Transistor Q4 is off because its base is connected to the output of AND gate G3 which is at a logical 0. Transistor Q3 is also off because its base is connected to the output of AND gate G2, which is also at logical 0. Since both transistors are off and essentially open circuits, electrode 20 is at the 4U potential.

In a similar manner, the inputs of AND gate G1 are at logical values 1 and 0 giving an output of logical 0 and for the same reasons electrode 10 is at the 4U potential.

All of the major division drive requirements are met with this circuit since the selected electrode is placed at the proper potential for incrementing (2U), all electrodes below it are clamped ON (4U) and all of the electrodes above it are clamped OFF (ground). FIG. 3B illustrates the major division drive circuitry for 10 major division electrodes. Its operation is essentially as discussed relative to the circuitry of FIG. 3A with inputs to the AND gate circuitry being provided through a BCD-to-decimal decoder 300.

The minor division electrode circuitry is illustrated in FIGS. 4A and 4B for a 2% bar graph, and FIG. 4C for a 1% bar graph. The minor division electrodes require that the selected electrode and all those below it are at the increment ON potential and all those above it are at the increment OFF potential. Furthermore, for a 2% bar graph, assuming 10 major division electrodes, resulting in 50 minor division electrodes, there must be five drivers for the minor division electrodes.

FIG. 4A shows only a portion of the minor division drive circuitry for a 2% bar graph display. In this example, electrodes 2 and 4 will be at the potential for the increment ON (potential U) and electrodes 6 and 8 will have the proper voltage level for the increment OFF (voltage 3U). Input C will be the selected input and will be at a logical 0, and all other inputs will be at logical 1's.

Starting at the top of FIG. 4A, both inputs of the exclusive OR gate G10 are at a logical 1 which produces a logical 0 at the output which is applied to the input of inverter G11. The output of inverter G11 is at a logical 1 which turns on transistor Q7. The collector of transistor Q7 is essentially at ground and this maintains transistor Q8 in the off condition, thereby placing electrode 8 at the 3U potential.

Inputs E and F of AND gate G7 are both at a logical 1 producing a logical 1 at the output which is also an input of the exclusive OR gate G8. The other input of exclusive OR gate G8 is connected to the output of the inverter G11 and is also at a logical 1 producing a logical 0 at the output of the exclusive OR gate G8. In the same manner as above, the electrode 6 is also placed at the 3U potential.

Input C (logical 0) and input D (logical 1) produce a logical 0 at the output of AND gate G4 which is one input of exclusive OR gate G5. The other input of exclusive OR gate G5 is connected to the output of inverter G9 which is at a logical 1, thereby producing a logical 1 at the output of the exclusive OR gate G5. This output is connected to inverter G6 which produces a logical 0 making transistor Q3 off and placing the base of transistor Q4 high, thereby turning it on. With the transistor Q4 on, electrode 4 is placed at the U potential.

Inputs A and B are both at a logical 1 making the output of AND gate G1 and one of the inputs of exclusive OR gate G2 also a logical 1. The other input of exclusive OR gate G2 is at a logical 0, so that the output of the inverter G3 is a logical 0. As explained above, this places electrode 2 through transistors Q1 and Q2 at the U potential.

All of the requirements for the minor division drive circuitry are met with this circuit. That is, the selected electrode and all those below it are placed at the increment ON potential (U) and all those electrodes above it are at the increment OFF potential (3U). This circuitry is shown in expanded condition in FIG. 4B for the 5 minor divisions in a 2% bar graph.

FIG. 4C illustrates the minor division drive circuitry for a 1% bar graph. In such an arrangement, the following modifications are made to the drive circuit used for the 2% display. First, the AND gates are eliminated because nine of the outputs of the decoder 401 are needed for nine of the minor division electrodes. Also, exclusive OR gates, inverters, and drive transistor groups are added to four of the five additional electrodes. Finally, the 0 minor division electrode, or fifth additional electrode, is tied directly to the 3U potential since it never needs to be turned on. For example, when changing from the values 29 to 30, instead of turning on the 0 minor division electrode and keeping the 30 major division electrode at the increment potential (the 10 and 20 major division electrodes being clamped ON), the major division electrode 30 is clamped ON and minor division electrodes 1 through 9 are turned off. Therefore, the minor division electrode 0 will never be on and can be tied to the OFF, or 3U potential.

An alternative to the bar graph type display, wherein a contrasting color is displayed from one end to the point of indication, is the cursor type display. In this arrangement, instead of a bar rising from the bottom of the display to the required value, only a segment of the bar at the required value is seen. In this type of electrophoretic display, the major division electrodes above and below the chosen segment are clamped OFF, and the major division electrode at the chosen segment is supplied with the proper voltage level for the increment mode. In the area of the chosen major division only the chosen minor division electrode is turned ON, and all other minor division electrodes are turned OFF. Table 2 summarizes the voltage levels required for operation of a cursor type display.

TABLE 2

| | Cursor Display Voltage Levels | |
| Major Division | Major Division Level | Minor Division Level |
| --- | --- | --- |
| Clamp OFF | Ground | * |
| Increment ON | 2U | U |
| Increment OFF | 2U | 3U |

*doesn't matter

It should be noted that while five voltage levels are required for the bar graph display, only four voltage levels are required for the cursor display because there is never a clamp ON condition.

The same cell construction used for the 2% bar graph display may be used for a 2% cursor display. However, the drive electronics are different and may be seen by reference to FIGS. 5 and 6. In operation of the 2% cursor bar graph display, when the input is zero, the entire display must be clamped OFF. Moreover, whenever a zero is input to the minor division drive circuit from circuit 602, the next lower major division electrode must be at the incremental potential, such as the major division electrode 20 seen in FIG. 6. The only exception is when the input to the entire display is zero.

Minor division outputs at positions 1 or 2 of the circuit 501 in FIG. 5 will turn on electrode 2. Outputs at positions 3 or 4 will turn on electrode 4, while outputs at positions 5 or 6 will turn on electrode 6 and outputs at positions 7 or 8 will turn on electrode 8. Finally, of course, outputs at positions 9 or 10 will turn on electrode 0.

The minor division electrode driver in FIG. 5 is similar to the minor division electrode driver for the 2% bar graph with certain changes. Namely, the feedback network to adjacent drivers is not required since only the selected minor division electrodes will be ON. Those division electrodes above and below the ON division electrode will be OFF. The 0 and 9 outputs of circuit 501 are connected together using two diodes and a resistor to voltage Vcc.

The increment voltage level U is applied to the selected electrode in a similar manner as in the bar graph driver. The base of the first transistor for the selected electrode is at a logical 0 and the transistor is off. This turns the next transistor ON and places the selected electrode at the U, increment ON, voltage level. In all other segment drivers, the base of the first transistor is at a logical 1 level to turn them on, which places the base of the second transistor at ground turning them off, thereby placing all the other electrodes at the 3U, increment OFF, voltage level. The 0 output of circuit 501 is connected to the base of a transistor which performs the function of an inverter whose output is $\bar{0}$. This $\bar{0}$ signal is used in the major division driver.

When the selected output of the minor division driver is 0, the major division driver must put the next lower value major division electrode at the increment potential. Also, when the input to the entire display is zero, all the major divisions must be clamped OFF. These two functions are implemented by making use of the $\bar{0}$ output from the minor division driver. In order for the major division to shift down one, a one must be subtracted from the major division input for circuit 601. In addition, there must be no selected major division electrodes in order for the entire display to be clamped OFF.

When the input of the circuit 601 exceeds nine, all of the outputs go to a logical 1 level i.e. no selected outputs. Each output of a circuit 601 is connected through a resistor, such as 603, to the base of a drive transistor 604 having a collector connected both to the 2U potential through a resistor 605 and the respective major division electrode. For the selected output, the base is at ground, the transistor is OFF, and the electrode is at the increment ON, or 2U, potential. For all other transistors, the base is at a logical 1, and the transistor is ON so that the electrodes are essentially at the clamp OFF, or ground, potential. This structure may be seen in FIG. 6.

If the total voltage 4U used in a bar graph display is 100 volts, then the increment switching voltage, or U, is 25 volts. At this value, the turn ON time $t_r$ is approximately 200 milliseconds and the turn OFF time $t_f$ is approximately 50 milliseconds. The turnoff time is shorter because the pigment does not have to traverse the entire cell to be hidden by the dye, while the pigment must cross almost the entire cell before it becomes visible in order to turn ON. Switching times are dependent on the applied voltage, the cell spacing, and the suspension since there can be either fast suspensions or slow suspensions.

Because of the way the bar graph cell is designed, the increment switching time is the longest switching time in the display. The increment switching time is the switching time obtained at the increment switching voltage, U. That is, the increment ON switching voltage is $2U-U=U$, while the increment OFF switching voltage is $2U-3U=-U$.

There are times from clamp ON to clamp OFF, for example, when the switching voltage can be 4U. In this case assuming 4U equals 100 volts, the time from clamp ON to clamp OFF would be approximately 8 milliseconds. For the reverse condition, the turn on time would be approximately 28 milliseconds.

While various embodiments of the present invention have been described, it is not intended to limit the present invention to only the specifically described embodiments, and all modifications suggested from the description of the invention are intended to be included.

What I claim:

1. An electrophoretic bar graph display comprising
two separated substrates with at least one substrate being transparent,
an electrophoretic fluid having suspended pigment particles filling the space between said substrates,
a first electrode structure formed on the surface of one of said substrates facing said fluid and a second electrode structure formed on a surface of the other of said substrates facing said fluid with at least one of said electrode structures being substantially transparent,
said first electrode structure providing a plurality of electrodes and said second electrode structure providing an equal number of electrodes for each of said plurality of electrodes,
means for providing at least one of three voltages to each of said first electrodes, and
means for providing at least one of two voltages to each of said second electrodes, said two voltages alternating in value with said three voltages.

2. An electrophoretic bar graph display according to claim 1, wherein a scale structure is provided to indicate a position of said electrophoretic fluid in accordance with said voltages applied to said first and second electrode structures.

3. An electrophoretic bar graph display according to claim 2, wherein said bar graph display is elongated.

4. An electrophoretic bar graph display according to claim 2, wherein said bar graph display is curved.

5. An electrophoretic bar graph display according to claim 1, wherein said bar graph display is elongated.

6. An electrophoretic bar graph display according to claim 1, wherein said bar graph display is curved.

7. An electrophoretic bar graph display according to claim 1, wherein the number of electric leads to said bar graph display equals the number m of electrodes of said second electrode structure for each of said plurality of electrodes plus the number n of said plurality of electrodes of said first electrode structure.

8. An electrophoretic cursor type display comprising
two separated substrates with at least one substrate being transparent,
an electrophoretic fluid having suspended pigment particles filling the space between said substrates,
a first electrode structure formed on the surface of one of said substrates facing said fluid and a second electrode structure formed on a surface of the other of said substrates facing said fluid with at least one of said electrode structures being substantially transparent,
said first electrode structure providing a plurality of electrodes and said second electrode structure providing an equal number of electrodes for each of said plurality of electrodes,
means for providing at least one of two voltages to each of said first electrodes, and
means for providing at least one of two different voltages to each of said second electrodes, said two different voltages alternating in value with said two voltages provided to each of said first electrodes,
wherein only a segment of said electrophoretic fluid is seen with a contrasting color from remaining portions of said electrophoretic fluid, said segment being provided at an indicating position.

9. An electrophoretic cursor type display according to claim 8, wherein a scale structure is provided to locate said indicating position in accordance with said voltages applied to said first and second electrode structures.

10. An electrophoretic cursor type display according to claim 8, wherein said cursor display is elongated.

11. An electrophoretic cursor type display according to claim 8, wherein said cursor display is curved.

12. An electrophoretic cursor type display according to claim 8, wherein the number of electrical leads to said cursor display equals the number m of electrodes of said second electrode structure for each of said plurality of electrodes plus the number n of said plurality of electrodes of said first electrode structure.

* * * * *

UNITED STATES PATENT AND TRADEMARK OFFICE
CERTIFICATE OF CORRECTION

PATENT NO. : 4,450,440
DATED : May 22, 1984
INVENTOR(S) : ROGER PAUL WHITE

It is certified that error appears in the above-identified patent and that said Letters Patent is hereby corrected as shown below:

In the Title Page:

Bracket 73, Change Assignee from "U.S. PHILIPS CORPORATION"
to --NORTH AMERICAN PHILIPS CORPORATION--.

Signed and Sealed this

Seventeenth Day of December 1985

[SEAL]

Attest:

DONALD J. QUIGG

Attesting Officer

Commissioner of Patents and Trademarks